United States Patent [19]

Shibata et al.

[11] Patent Number: 4,957,876
[45] Date of Patent: Sep. 18, 1990

[54] RESIN SEALED SEMICONDUCTOR DEVICE AND A METHOD FOR MAKING THE SAME

[75] Inventors: Hiroshi Shibata; Fuyuki Maehara, both of Kariya; Akira Shintai, Chita; Hidetoshi Kato, Suzuka, all of Japan

[73] Assignee: Nippondenso Co., Ltd., Kariya, Japan

[21] Appl. No.: 466,655

[22] Filed: Jan. 17, 1990

Related U.S. Application Data

[62] Division of Ser. No. 201,757, Jun. 3, 1988, Pat. No. 4,899,209.

[30] Foreign Application Priority Data

Jun. 5, 1987 [JP] Japan .................................. 62-142043
Apr. 30, 1988 [JP] Japan .................................. 63-108520

[51] Int. Cl.$^5$ ........................................... H01L 21/64
[52] U.S. Cl. .................................... 437/209; 437/211; 264/272.17
[58] Field of Search ............................. 437/209, 211; 264/272.17

[56] References Cited

U.S. PATENT DOCUMENTS

| 4,092,487 | 5/1978 | Imai | 29/627 |
| 4,530,003 | 7/1985 | Blair et al. | 357/81 |
| 4,649,637 | 3/1987 | Hatakeyama | 29/588 |

FOREIGN PATENT DOCUMENTS

| 18838 | 9/1968 | Australia. | |
| 60964 | 3/1971 | Australia. | |
| 26492 | 9/1972 | Australia. | |
| 65994 | 1/1981 | Australia. | |
| 23165 | 1/1981 | European Pat. Off.. | |
| 47195 | 3/1982 | European Pat. Off.. | |
| 102041 | 3/1984 | European Pat. Off.. | |
| 146330 | 6/1985 | European Pat. Off.. | |
| 57-79681 | 5/1982 | Japan | 437/209 |
| 61-67943 | 4/1986 | Japan | 437/209 |
| 64-7496 | 2/1989 | Japan. | |
| 94264 | 12/1987 | Taiwan. | |

Primary Examiner—Brian E. Hearn
Assistant Examiner—Andrew Griffis
Attorney, Agent, or Firm—Cushman, Darby & Cushman

[57] ABSTRACT

This invention provides a resin sealed IC regulator, which comprises a first connecting terminal electrically connected to a generator, a second connecting terminal electrically connected to a device other than the generator, a monolithic IC which controls an operation of the generator, mounted on a conductive member, and connected to both the first connecting terminal and the second connecting terminal and a resin molded portion of an electric insulating resin sealing the monolithic IC and at least a portion of the first and second connecting terminals are connected to the monolithic IC.

Whereby an IC regulator which can be effectively used with an electrical load can be obtained, and further, an IC regulator having a more reliable control performance and able to be produced at low production cost can be obtained.

15 Claims, 16 Drawing Sheets

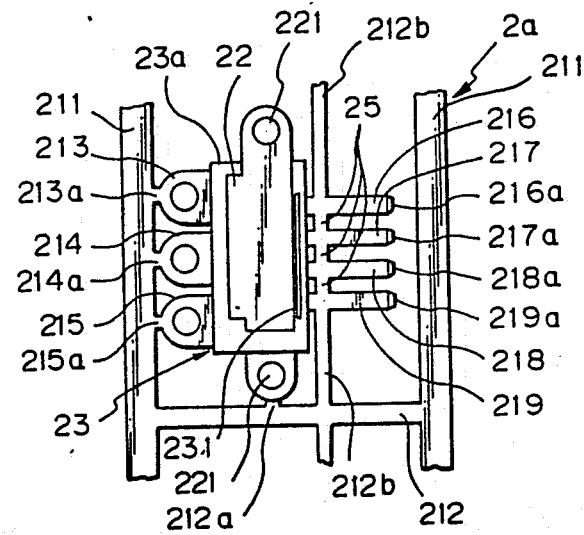
Fig. 13
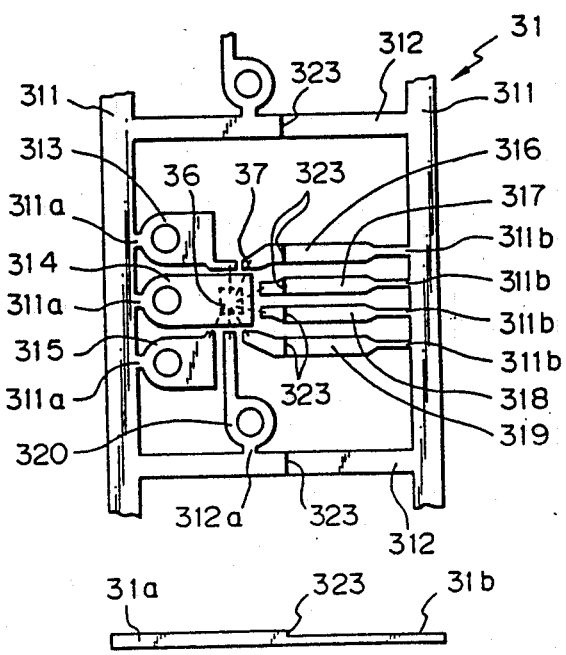
Fig. 14
Fig. 15

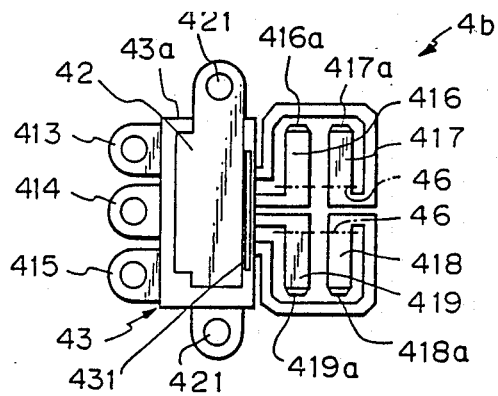
Fig. 21
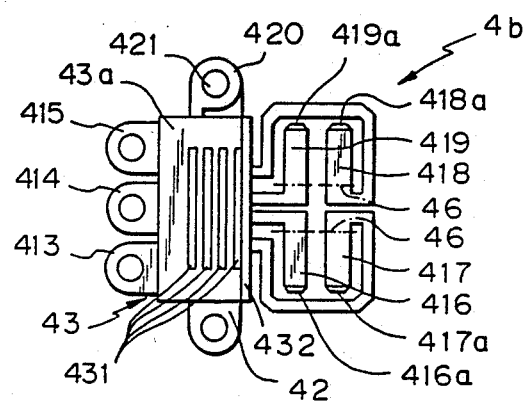
Fig. 22
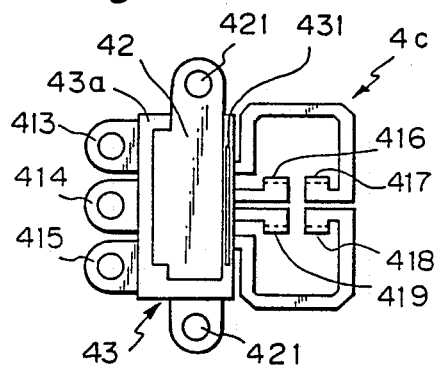
Fig. 23
Fig. 24

RESIN SEALED SEMICONDUCTOR DEVICE AND A METHOD FOR MAKING THE SAME

This is a division of application Ser. No. 07/201,757, filed June 3, 1988, now U.S. Pat. No. 4,899,209.

BACKGROUND OF THE INVENTION

1. Field of the Invention

This invention relates to a resin sealed semiconductor device and a method for making the same and is preferably applicable to an IC regulator (integrated semiconductor regulator) used as a voltage regulator, for example, as an A.C. generator acting an alternator, for vehicles.

2. Description of the Related Art

Heretofore, an IC regulator, as described in Japanese Utility Model Publicatiion No. 57-44717, is a hybrid IC comprising a substrate (for example, a ceramic substrate) on which ICs, transistors and chip condensers or the like are mounted, incorporated into a shield case having a connector thereon, and this case is mounted on an electrical load.

However, such a hybrid increases the size of the device, and the number of components used in this device is also increased, and therefore, many operational steps are required, for its assembly which will reduce the reliability of the device.

Recently, the requirements for high integration and minimized size have increased and consequently, for example a controlling circuit for an electric load has been integrally incorporated with a power device for energizing the the electric load. Such a device is reduced to a monolithic integrated circuit (IC).

There is a trend for such a monolithic IC to become more minimized, lighter and cheaper, for directly mounting the same on an electrical load.

When making such a resin sealed semiconductor device in which a monolithic IC mentioned above is incorporated, a lead frame in which each connecting terminal is connected to an outer frame thereof is used, to reduce the number of components used in the device and the number of operational steps. But, assuming that the electrical load is an A.C. generator or the like and it is necessary to control the operation thereof, the IC regulator must be in electrical contact with connecting terminals in the A.C. generator for transmitting signals back and forth and energizing current, and simultaneously, must maintain electrical contact with a portion other than the A.C. generator for transmitting signals back and forth and energizing current. Namely, connecting terminal for connecting to an electrical load, and other connecting terminals for connecting to an external device other than the load, are generally required. More specifically, such a device generally must have connecting terminals for connecton to the A.C. generator and connecting terminals for connecton to a device other than the A.C. generator, and further, must ensure that the connecting terminal connected to the device other than the A.C. generator is not bent by mechanical impact.

Also such a device must usually form a connector with resin by a molding method because, in general, each connecting terminal has a high input impedance, and therefore, a water-proof construction is required.

Accordingly, it is difficult to apply the current technology, in which a lead frame is used in the resin sealed semiconductor device, to this problem, and therefore, a resin sealed IC regulator using a lead frame is not currently available.

Therefore, solutions to these problems are required.

SUMMARY OF THE INVENTION

Accordingly, this invention was created in view of the problems mentioned above, and therefore, the object of this invention is to provide a semiconductor device used as a power device, and having a controlling circuit for an electric load being integrated therewith, having a small number of the components, and able to be produced at a low cost due to a reduction of the number of process steps, and further, to provide a semiconductor package having connecting terminals and able to be produced at a low cost by reducing the process steps in such a way that a molding operation for forming a water proof connector housing and a sealing operation for sealing a monolithic IC are carried out simultaneously.

Another object of this invention is to provide a device which does not require a special configuration for separating the connecting terminals connected to external portions for a resin sealed semiconductor device having a connector housing molded by a connector molding method and surrounding the connecting terminal, connected to the external portions.

A further object of this invention is to provide a method for making a resin sealed semiconductor device by which the number of components is reduced and the number of operational steps is also reduced, utilizing a lead frame.

Figure 5:
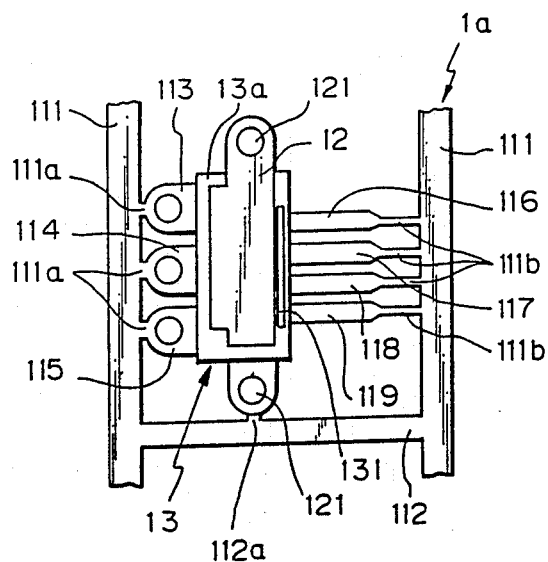
Figure 6:
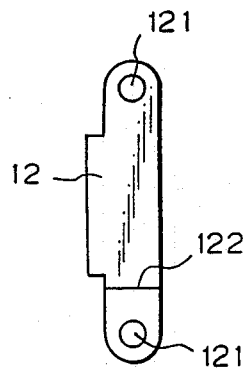
Figure 7:
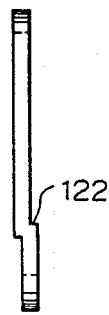
Figure 8:
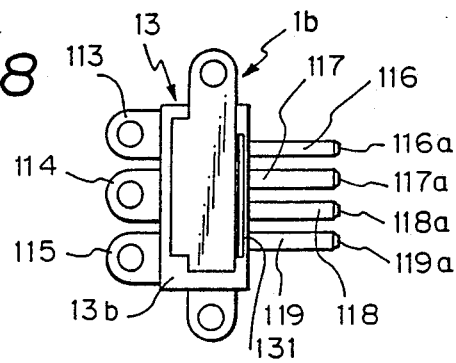
Figure 10:
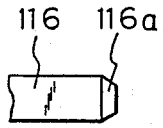
Figure 9:
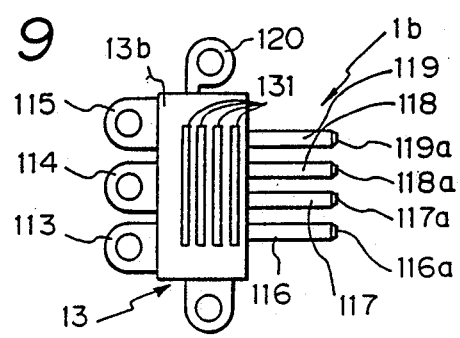
Figure 11:
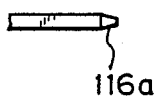
Figure 12:
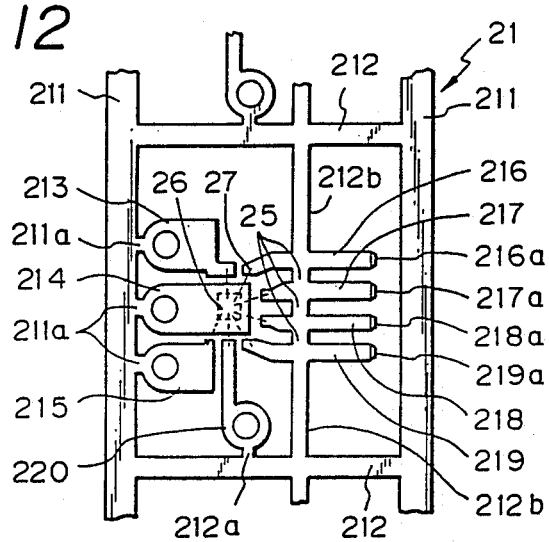
Figure 16:
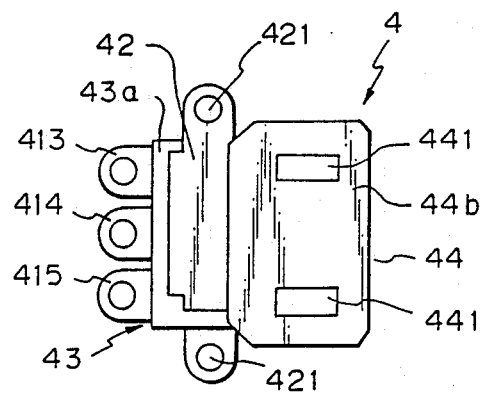
Figure 17:
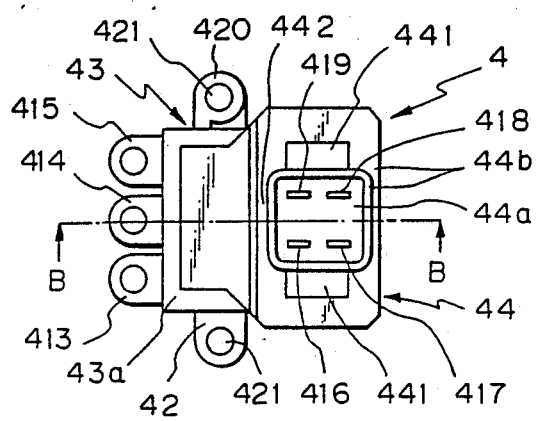
Figure 18:
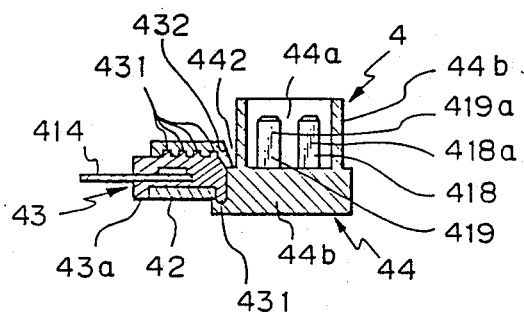
Figure 19:
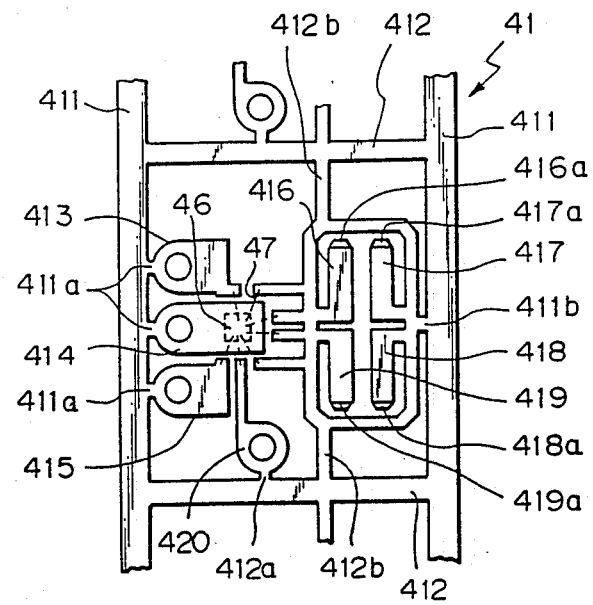
Figure 20:
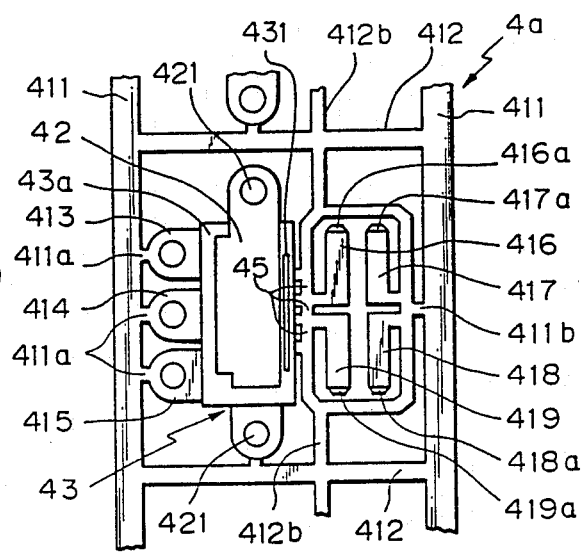
Figure 25:
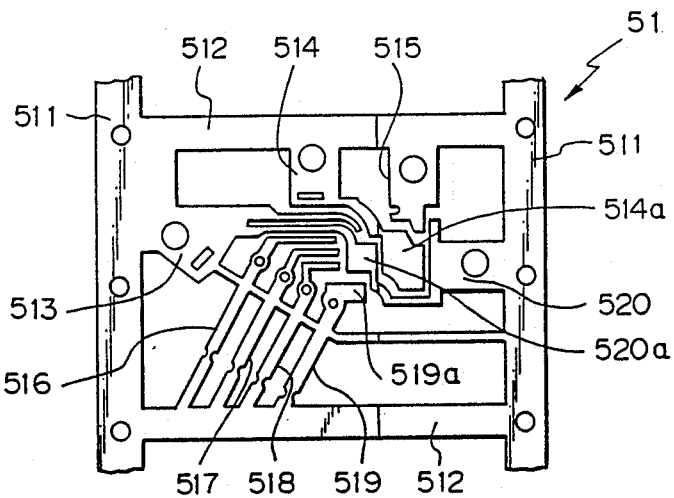
Figure 26:
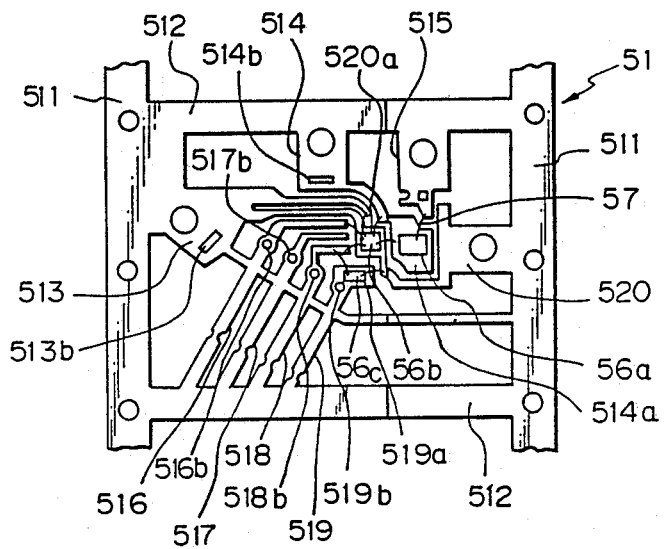
Figure 27:
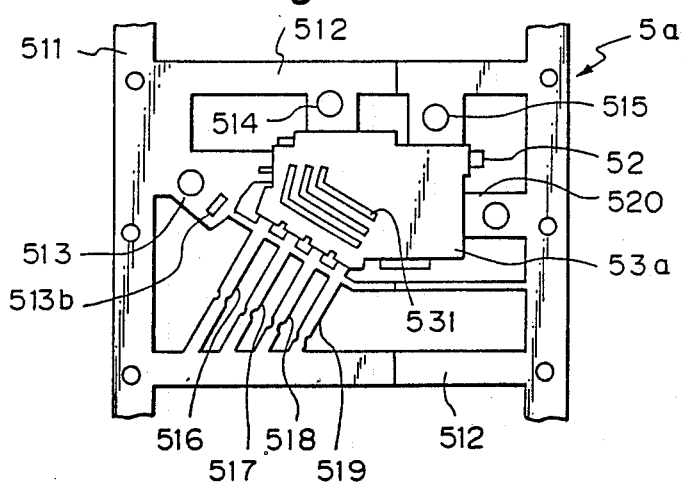
Figure 28:
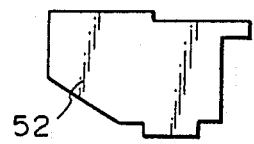
Figure 29:
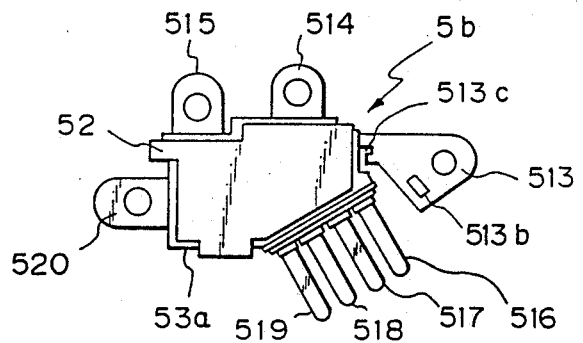
Figure 30:
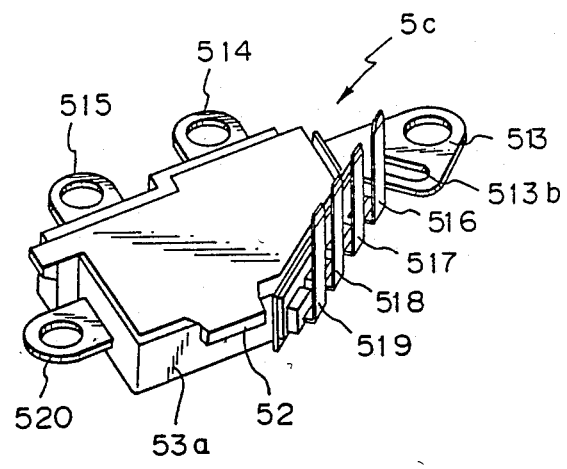
Figure 31:
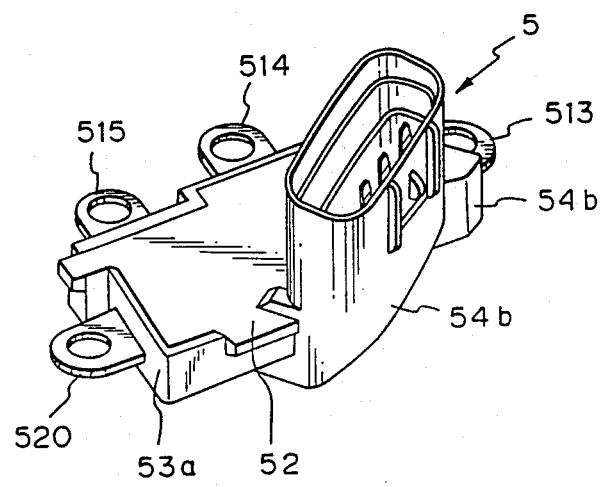
Figure 32:
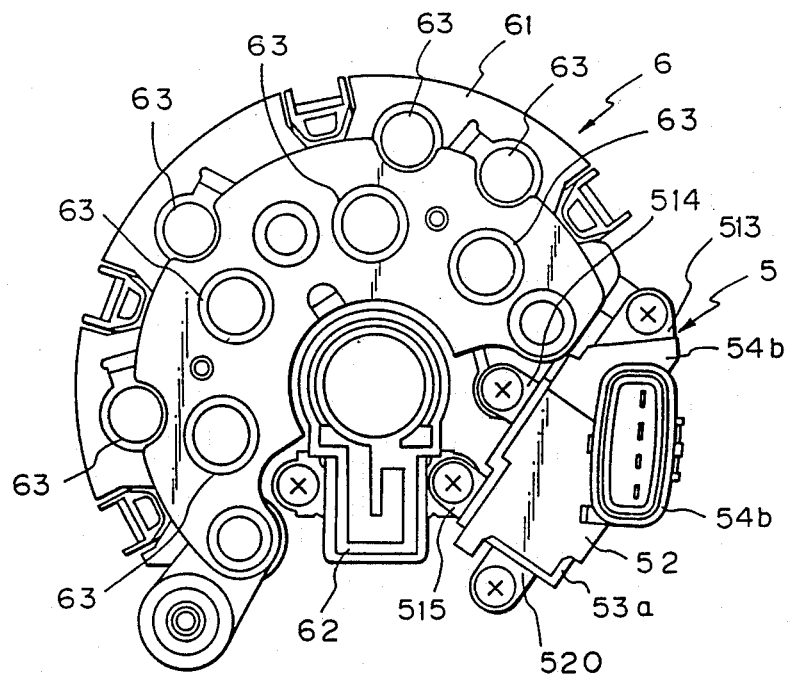
Figure 34:
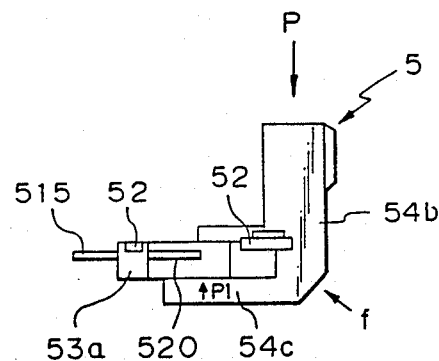
Figure 33:
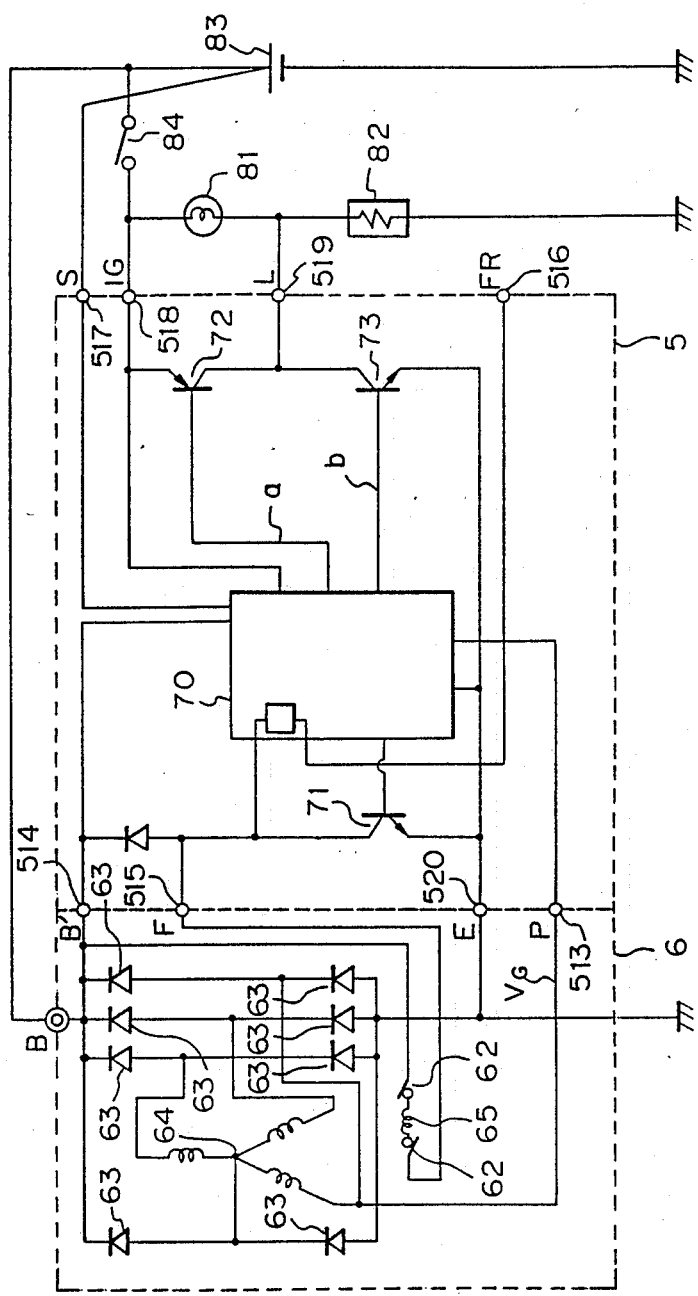
Figures 35A, 35B, 35C:
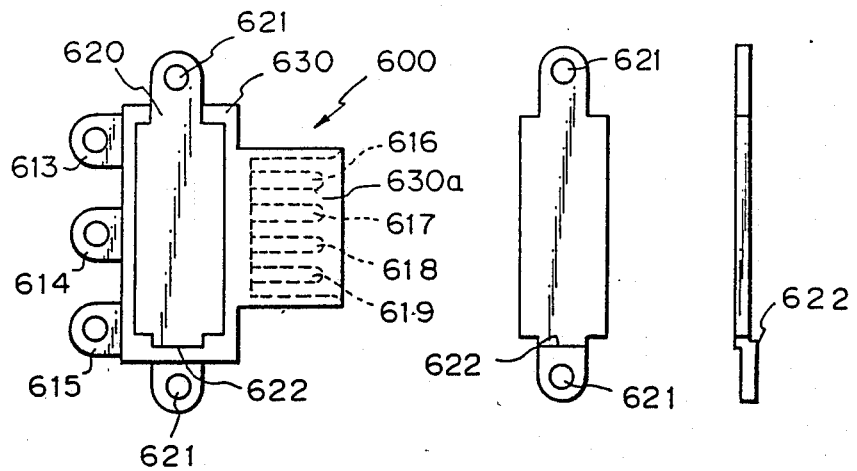
Figure 36:
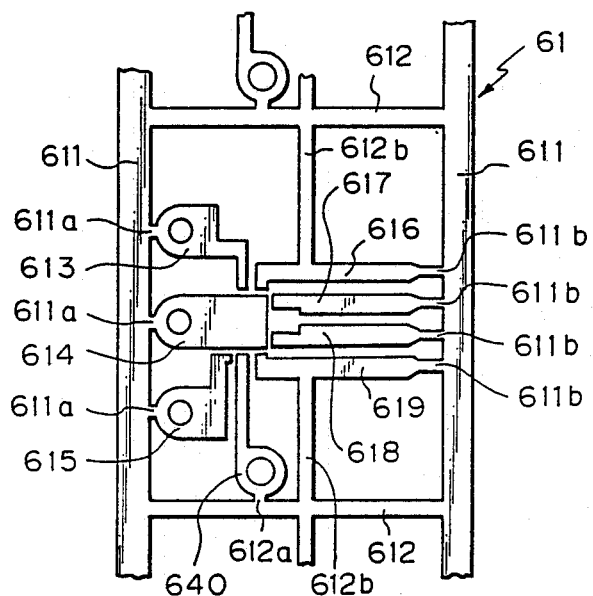
Figure 37:
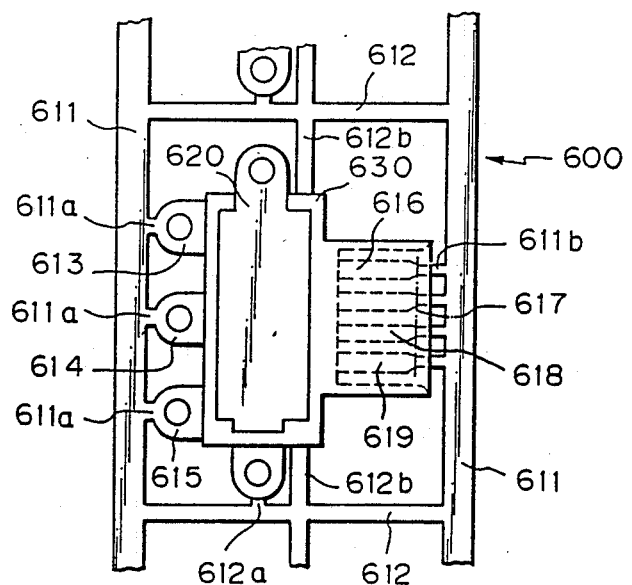
Figure 38:
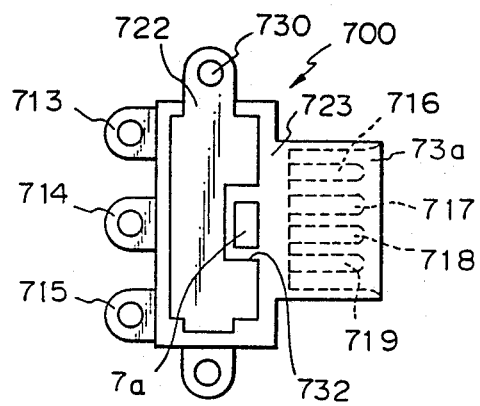
Figure 41:
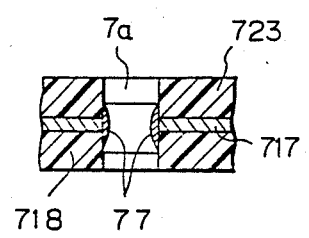
Figure 39:
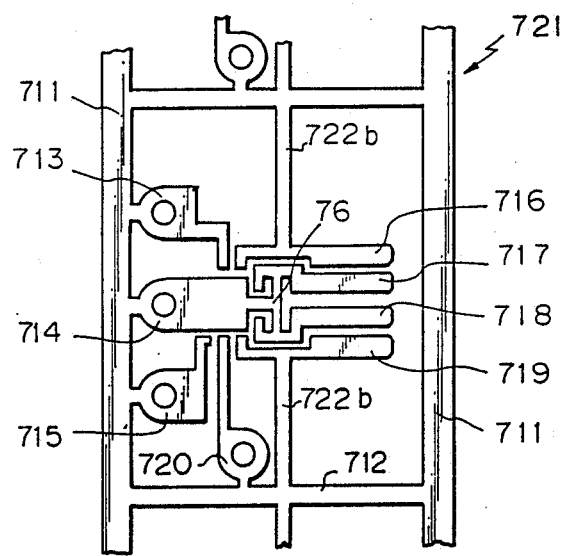
Figure 40:
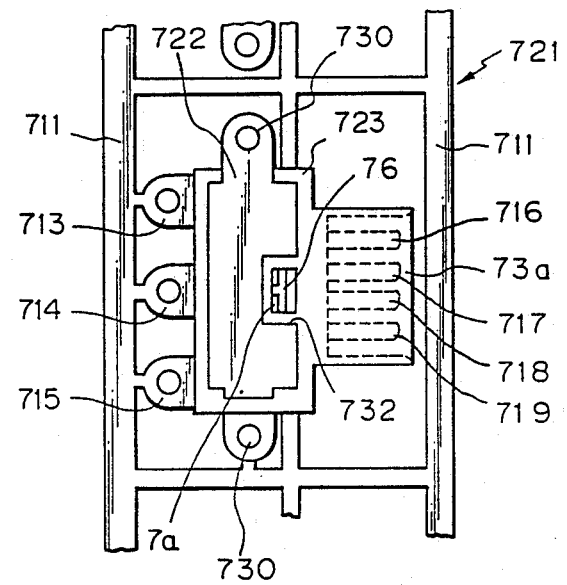

FIG. (4b) shows a back plane view of a lead frame on which a monolithic IC is mounted;

FIG. 5 shows a plane view of a lead frame on which a resin sealed monolithic IC portion is molded in Example 1;

FIGS. 6 and 7 are a plane view of a heat sink and a side view of a heat sink respectively;

FIGS. 8 and 9 show a front plane view and a back plane view of a resin sealed monolithic IC portion after cutting off frame portions, respectively;

FIGS. 10 and 11 are a plane view and a side view of a fabricated portion of an end tip portion of an external connecting terminal, respectively;

FIG. 12 shows a plane view of a lead frame on which a monolithic IC is mounted in Example 2;

FIG. 13 shows a plane view of a lead frame on which a resin sealed monolithic IC portion is molded in Example 2;

FIG. 14 and 15 are a back plane view and a side view of a lead frame on which a monolithic IC is mounted in Example 3, respectively;

FIGS. 16 and 17 are a front and back plane view of a resin sealed semiconductor device in Example 4 respectively;

FIG. 18 is a sectional view taken along the line B—B in FIG. 17;

FIG. 19 shows a back plane view of a lead frame on which a monolithic IC is mounted in Example 3;

FIG. 20 shows a plane view of a lead frame on which a resin sealed monolithic IC portion is molded;

FIGS. 21 and 22 are a front plane view and a back plane view of a resin sealed monolithic IC portion separated from a frame portion of a lead frame, respectively;

FIG. 23 ad 24 are a plane view and a sectional view of the resin sealed monolithic IC portion shown in FIG. 21, in which external connecting terminals are bent, respactively;

FIG. 25 shows a plane view of a lead frame used in the Example 5;

FIG. 26 shows a plane view of a lead frame used in the Example 5, on which a monolithic IC is mounted;

FIG. 27 shows a plane view of a lead frame shown in FIG. 26, on which a resin sealed monolithic IC portion is molded;

FIG. 28 shows a plane view of a heat sink;

FIG. 29 shows a back plane view of a resin sealed monolithic IC portion separated from a frame portion of a lead frame;

FIG. 30 is a perspective view of a resin sealed monolithic IC portion shown in FIG. 29 in which external connecting terminals are bent;

FIG. 31 is a perspective view of an IC regulator made in Example 5;

FIG. 32 is a plane view showing a configuration in which the IC regulator is mounted on an alternator;

FIG. 33 shows an electric circuit related to the IC regulator and the alternator;

FIG. 34 shows a side view of the IC regulator used in Example 5;

FIG. 35 (A) shows a plane view of a resin sealed semiconductor device made in Example 6;

FIGS. 35 (B) and (C) show a plane view and a side view of a heat sink used in Example 6, respectively;

FIG. 36 shows a plane view of a lead frame used in Example 6;

FIG. 37 shows a plane view of the resin sealed semiconductor device with a connector housing molded on the lead frame shown in FIG. 36;

FIG. 38 shows a plane view of a resin sealed semiconductor device made in Example 7;

FIG. 39 shows a plane view of a lead frame used in Example 7;

FIG. 40 shows a plane view of the resin sealed semiconductor device with a connector housing molded on the lead frame; and, FIG. 41 shows an aperture portion provided on the resin sealed semiconductor device with sealing portion therein.

DESCRIPTION OF THE PREFERRED EMBODIMENT

To attain the object of this invention, the resin sealed semiconductor device of this invention is characterized in that a resin sealed semiconductor device, which comprises a first connecting terminal electrically connected to an electric load, a second connecting terminal electrically connected to a device other than the electric load, a monolithic IC which controls an operation of the load mounted on a conductive member and electrically connected to both the first connecting terminal and the second connecting terminal, and a resin molded portion of an electric insulating resin sealing the monolithic IC and solidly fixing the monolithic IC and at least a portion of the first and second connecting terminals connected to the monolithic IC.

To attain the object of this invention, the resin sealed semiconductor device of this invention is further characterized by comprising, a first connecting terminal electrically connected to an electric load, a second connecting terminal electrically connected to a device other than the electric load, a monolithic IC which controls an operation of the electric load mounted on a plate and electrically connected to both the first connecting terminal and the second connecting terminal, a first molded portion in which the monolithic IC and at least a portion of the first and second connecting terminals connected to the monolithic IC are sealed with a first resin, and a second molded portion formed by an externally covering molding method to cover at least a portion of the first molded portion externally with a second resin in such a manner that at least a portion of the first molded portion is held by the second molded portion.

The resin sealed semiconductor device of this invention is further specifically characterized by comprising a connector housing made by a connector molding method carried out simultaneously with or following the externally covering molding method utilizing the second resin and the second connecting terminal is surrounded within a cavity provided in the connector housing.

The first resin and the second resin may be the same kind of resin or may be different kinds of resins, for example, having different chemical components, viscosity, or strength, or the like.

In this invention, the resin used as a first resin may be a thermosetting resin and the second resin may be a thermoplastic resin.

The second resin may be molded in such a manner that at least a root portion of the second connecting terminal extending outwardly from the first molded portion molded with the first resin is covered with the second resin.

Further, a contacting surface of each of the first and the second resins is roughened, and such a roughened surface may be provided for example, with concave and convexe portions or grooves or ribs.

In another embodiment of this invention, the resin sealed semiconductor device is characterized by comprising, a first connecting terminal electrically connected to an electric load, a second connecting terminal electrically connected to a device other than the electric load and bent at a predetermined angle, a monolithic IC which controls an operation of the electric load mounted on a plate and electrically connected to both the first and the second connecting terminal, a heat sink made of a high thermal conductive material, a sealed monolithic IC portion in which the heat sink is fixed in proximity to the monolithic IC by molding with a first resin and the monolithic IC and at least a portion of the first and second connecting terminals connected to the monolithic IC are sealed together with a first resin, a molded portion formed by an externally covering molding method with a second resin (referred to as second molded portion) whereby at least a portion of the sealed portion described above (referred to as first molded portion hereafter), is covered with the second molded portion in such a manner that the first molded portion is held by the second molded portion to strengthen the contacting force therebetween and a connector housing integrally molded with the second molded portion-as described above made by a connector molding method for surrounding the second connecting terminal with a second resin, being bent together with the second connecting terminal.

To attain the other object of this invention, the method for making the resin sealed semiconductor device is characterized by comprising, forming a lead frame in which at least a first connecting terminal electrically connected to an electric load and a second connecting terminal connected to a device other than the electric load are connected to a frame portion thereof, made of a plate of an electric conductive material, mounting a monolithic IC controlling an operation of the electrical load on a conductive member and electrically connecting the monolithic IC to the lead frame, sealing the monolithic IC mounted on the conductive member and at least a portion of the first and second connecting terminals electrically connected to the monolithic IC with a first resin having an electric insulation characteristic, separating the frame portion from the lead frame and making a molded portion by a molding method including an externally covering molding method, or if desired, additionally by a connector molding method to provide a connector housing surrounding the second connecting terminal with a second resin having an electric insulation characteristic.

The most characteristic feature of this invention is the construction thereof comprising a plurality of first connecting terminals, at least one a second connecting terminal, a monolithic IC which controls an operation of the electrical load mounted on a and connected to both the first connecting terminal and the second connecting terminal and a resin molded portion of an electric insulating resin sealing the monolithic IC and at least a portion of the first and second connecting terminals connected to the monolithic IC, wherein each connecting terminal is directly extended from the out side of the molded portion into a portion adjacent to the monolithic IC in the molded portion in a form of single piece, and the extended portion of the connecting terminal is rigidly fixed within the resin and the molded portion further comprising a connector housing integrally mounted thereon, and surrounding the second connecting terminals.

In this invention, by adopting the construction described above, each connecting terminal can be given a suitable thickness for end use and, therefore, the strength of each connecting terminal is increased wherein contact with an opposite connecting portion. Also, if desired, a means of fixing means for the connecting terminal to a fixing point of the another device can be provided on the connecting terminal.

Especially, when using this device in an alternator, which is one object of this invention, this device can be fixed in contact with the connecting portion thereof, and vibration of the alternator when energized will not affect same. Further, in this construction, since one end of the connecting terminal is located adjacent to the monolithic IC, therefore, a length of a wire for wire bonding can be considerably reduced, and thus the production efficiency is increased because the occurrence of defective products caused by a molding operation is greatly reduced.

In this invention, to improve a close adherence force between the first resin and second resin, an externally covering molding operation is adopted.

Note, "an externally covering molding method" referred to herein is a molding method in which at least a portion of the first molded portion is covered with the second molded portion in such a manner that at least a portion of the first molded portion is held by the second molded portion and, if desired, the externally covering molding method can be carried out simultaneously with a connector molding method to make a connector housing surrounding the second connecting terminals, of the same resin used for the second molded portion.

Another specific characteristic feature of this invention is that the first connecting terminal can be directly connected to a portion on the electrical load and the second connecting terminal can be used as a connector.

Namely, in this invention, the semiconductor device has at least two different kind of groups of connecting terminals, in that the first group is the first connecting terminals that can output or input electric information signal related to a control of an electrical load, and the second group is the second connecting terminal that can input an electric information signal related to a power source to a control circuit of a monolithic IC and output an electric information signal related to a control of the electrical load.

In making such a semiconductor device, many components were used in such a device and, therefore, a drawback arose in that to integrally combine such components, an increment of the number of the components and the number of the process steps was required and further, another drawback occurred in that in such a device, many cut portions, produced by cutting a connecting portion between the terminal and the lead frame, appear on a surface of the regulator. However, these problems are also resolved in this invention.

EXAMPLE

Hereafter, this invention will be explained by way of examples with reference to with drawings.

EXAMPLE 1

Figure 1:
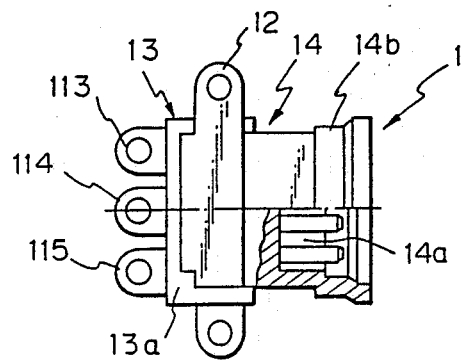
FIGS. 1 to 3 show a front plane view, a back plane view, and a sectional view of a resin sealed semiconductor device made in Example 1, respectively.
Figure 2:
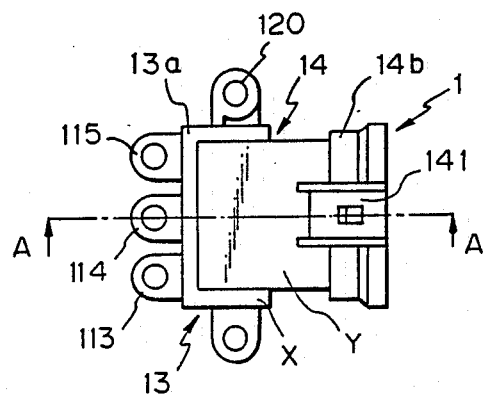
Figure 3:
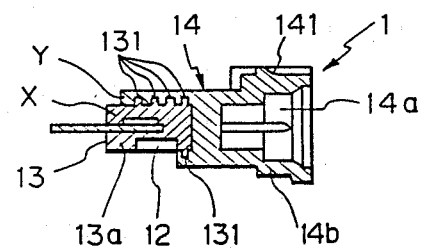

FIG. 1 and FIG. 2A show a front plane view and a back plane view of a resin sealed semiconductor device in the Example 1 of this invention, respectively and FIG. 3 shows a cross sectional view taken along the line A—A of FIG. 2.

This resin sealed semiconductor device 1 comprises a connector housing 14 including a second molded portion Y integrally molded with the housing 14, a sealed monolithic IC portion 13, i.e., a first molded portion X which is partially covered by the second molded portion Y, integrated with the connector housing 14 and a heat sink (heat radiating plate) 12.

The second molded portion Y is formed by an externally covering molding method to cover at least a main surface of the sealed monolithic IC portion 13, i.e., the first molded portion X, in such a manner that the first molded portion is held by the second molded portion and the connector housing 14 is integrated with the second molded portion Y, is formed by connector molding method carried out simultaneously with the externally covering molding method, and this connector housing surrounds a group of connecting terminals connected to the external separate portion, and forms a cover.

Figure 4A:
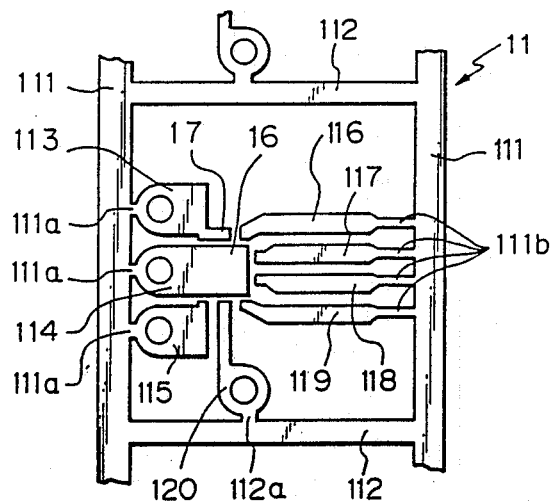
FIG. 4(a) shows a front plane view of a lead frame used in Example 1.
Figure 4B:
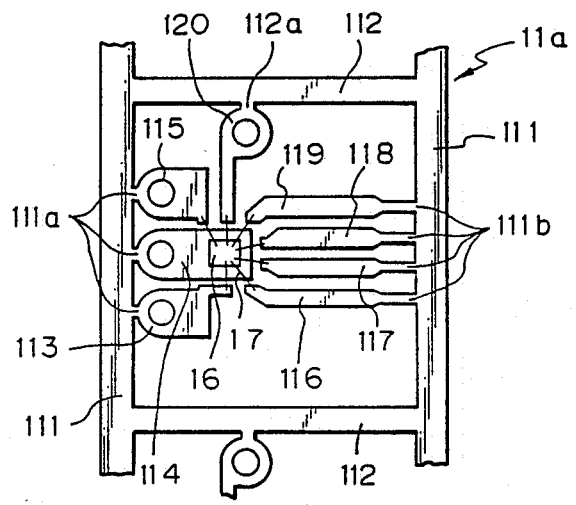

The sealed monolithic IC portion 13 is produced by a method in which the monolithic IC 16 is first mounted on a predetermined portion of a back side of the lead frame 11, as shown in FIG. 4 (a), and the monolithic IC 16 and each of the connecting terminals are electrically connected by lead wires 17 to get a lead frame 11a as shown in FIG. 4 (b), and thereafter, the lead frame 11a is sealed with a resin 13a.

The lead frame 11 is made from a plate by a punching method and consists of a frame portion, a group of connecting terminals, and a connector portion for the heat sink; the frame portion being separated from the lead frame before the resin sealed semiconductor device is formed.

Both contacting surfaces of the resin 13a for sealing the monolithic IC and of the resin 14b for molding a connector housing, i.e., a contacting surface between the first molded portion X and the second molded portion Y, are provided with roughened surfaces: For example, a plurality of projected lines or ribs 131 are provided on the surface of the sealed monolithic IC portion 13 and cause a fixed adhesion thereof with the resin 14b.

A cavity 14a, which is defined by the connector housing and it has a construction such that it can be connected to a female adapter of a counterpart connector, is defined as an atmospheric portion of the connecting terminal connected to the external separated portions.

The lead frame 11 shown in FIG. 4 (a) is formed from a plate made of copper alloy having an even thickness, by a mechanical process such as a punching method, and has two external frame portions 111 extending vertically and two transverse frame portions 112 connected to the external frame portions 111.

Each inside portion enclosed by the two external frame portions 111 and two transverse frame portions 112 has three internal connecting terminals 113, 114 and 115 connected to one of the external frame portions 111 through a later cut out connecting portion 111a having a shorter length, and 4 external connecting terminals 116, 117, 118 and 119 connected to the other external frame portions 111 through a tie bar 111b and a heat sink connector 120 connected to the transverse frame portion 112 through a short connecting portion 112a.

These portions such as internal connecting terminals 113, 114, and 115, external connecting terminals 116, 117, 118, and 119, and heat sink connector 120 are separated from the external frame portions 111 and transverse frame portions 112 when the resin sealed monolithic IC portion 13 is formed by a resin whereby each is electrically separated from the other.

The opposite end of each terminal corresponds to each electrode of the monolithic IC 16, respectively, and are bonded thereto.

In this invention, internal connecting terminals 113, 114, and 115 are connecting terminals electrically connected to an electrical load, for example, an alternator or a generator, and correspond to the first connecting terminal, and the external connecting terminals 116, 117, 118, and 119 means are connecting terminals electrically connected to a device other than the electrical load, which device is located separately from and externally of the load and correspond to the second connecting terminals.

Further, an electrically conductive material used in this invention is provided integrally with the internal connecting terminal 114.

The lead frame 11 of this invention may be treated by a chemical treatment such as etching, or the surface thereof may be plated, taking the solderability and wire-bonding ability thereof into account.

In this invention, a plate that has been already plated also can be used as the lead frame.

As shown in FIG. 4 (b), after the monolithic IC 16 is fixedly mounted on a predetermined portion of the lead frame 11 by for example, soldering, the opposite end of each connecting terminal and each electrode of the monolithic IC 16 is wire-bonded, respectively.

Then a resin sealed monolithic IC portion 13 is formed by sealing the monolithic IC 16 and at least a portion of the internal connecting terminals 113, 114 and 115 and the external connecting terminals 116, 117, 118, and 119, with the resin 13a.

Namely, first, a heat sink 12 made of a metal having a good heat conductivity such as aluminum or copper is fixed inside a first molding die, and then a lead frame 11a having a monolithic IC 16 mounted thereon is fixed thereover and a clamping operation performed.

The heat sink 12 of this invention has a rectangular shape having projecting portions extended in a longitudinal direction of the shape provided with an aperture 121 for fixing a connecting terminal, and further, on one of the projecting portions, a step like portion 122 is provided as shown in FIGS. 6 and 7.

Since the heat sink 12 is fixed inside of the molding die in such a way that it is in contact with only the heat sink connector portion 120 of the lead frame 11, by utilizing the step like portion 122, the heat sink 12 is electrically separated from all of the connecting terminals except the heat sink connector portion 120, after the molding operation with resin is carried out and predetermined parts cut off.

After the clamping operation, a certain resin 13a is injected into a cavity of the molding die and solidified, and therefore, a lead frame 1a having a resin sealed monolithic IC portion 13 can be obtained as shown in FIG. 5.

Next, the frame portion of this lead frame 1a is cut by using a die. Namely, a boundary portion between each of the internal connecting terminals 113, 114, and 115 and a connecting portion 111a and a boundary portion between the each external connecting terminals 116, 117, 118 and 119 and tie bar 111b, and further, a boundary portion between the heat sink connector portion 120 and the connecting portion 112a, are cut.

In this example, each tip end portion 116a, 117a, 118a, and 119a of the external connecting terminals 116, 117, 118, and 119, respectively, may be pressed in a direction of a thickness of the terminal to make a tapered end portion, and both of the end corners located widthwise of the terminal may be chamfered as shown in FIGS. 10 and 11. The molded body thus obtained is referred to as a first molded body 1b.

On the other hand, on a contacting surface between a resin 13a of a resin sealed monolithic IC portion 13 and a resin 14b for molding a connector, some projecting portions, for example, rib portions or projecting lines or the like, are provided to strengthen the contacting surface by increasing a mutual engaging ability therebetween, as shown in FIGS. 8 and 9.

Then, the first molded portion is fixedly mounted on a second molded die and clamped, and thereafter, a resin sealed monolithic IC is obtained by a molding method with a resin 14b, as shown in FIGS. 1, 2, and 3.

In this example, the resin sealed monolithic IC and external connecting terminals 116, 117, 118, and 119 are molded by an externally covering molding method with the resin 14b, and at the same time as shown in FIGS. 1 and 3, the root portion of the external connecting terminals are sealed with a resin, for improving the moisture proof characteristic.

In the second molded portion Y, each tip end portion 116a, 117a, 118a, and 119a of the external connecting terminals 116, 117, 118, and 119, respectively, are positioned inside a cavity (a concave portion) 14a of the connector made of the molded resin 14b.

The resin sealed semiconductor device of this example of this invention can be obtained by using a lead frame as described above, and consequently, the steps for setting each connecting terminal and for covering a shield case required in a process for making a ordinary device having a hybrid construction are eliminated, and the number of components and the number of steps can be reduced because of a pluralilty of these molded bodies can be obtainded simultaneously.

Further, a cutting operation of the lead frame can be carried out easily and accurately by separately performing a molding process for the connector housing and a sealing process for the monolithic IC.

In this invention, the cutting off operation for cutting the frame portion from the lead frame, and the molding operation for forming the connector housing, are carried out after the operation for sealing the monolithic IC, and thus, an advantage can be obtained such that, since the root portions of the external connecting terminals 116, 117, 118 and 119 are sealed with a resin 14b, the deterioration due to moisture, which used to occurr when the lead frame was cut off, can be effectively avoided.

Furthermore, the resin 13a for sealing a monolithic IC and the resin 14b for molding a connector housing by an external covering molding method may be different each to other in this invention. For example, when a thermosetting epoxy resin having good moisture proof characteristic, stress proof characteristic, and molding ability is used as the resin 13a, and a thermoplastic resin such as PBT (polybutylene telephthalate), PPS (polyphenylenesulfide), and 66-Nylon having a good mechanical strength and dimensional stability are used as the resin 14b, a semiconductor package having a good moisture proof characteristic, stress proof characteristic and a good mechanical strength and dimensional stability, can be obtained.

Moreover, as described above, when both the thermosetting resin and thermoplastic resin are used simultaneously, there is less adhesive force between these resins and the moisture proof characteristic is usually reduced. Such a defect can be overcome by providing projecting portions 131 on the surface of the resin sealed monolithic IC portion 13 and molding with the resin 14b which increases the engagement force between the resins 13a and 14b.

In this invention, the resin used may preferably have, for example, Izod impact strength of more than 3 kg.f.cm/cm and a bending strength of more than 8 kg.f/mm².

Accordingly, by obtaining a closer engagement between the resins 13a and 14b, the semiconductor package thus obtained has a construction such that the intrusion of moisture at an interface between the resins can be avoided, and therefore, the moisture proof characteristic is improved.

On the other hand, instead of using the projecting portion 131, the surface may be provided with an uneven configuration for obtaining a close engagement between both resins and increase an interclinching force therebetween.

In this example, the external frame portions 111, transverse frame portions 112, connecting portion 111a 112a, and tie bar 111b are cut off after the resin sealed monolithic IC portion 13 is formed, but these cut off portions are disposed outside of the resin sealed monolithic IC portion 13, and consequently, when the cutting operation is carried out, the operation does not have an adverse affect on the wire-bonding already performed, because that the wire-bonded portions are completely sealed off by the resin.

Therefore, the resin sealed semiconductor device of this invention has superior moisture proof and mechanical strength characteristics.

On the other hand, as each tip end portion 116a, 117a, 118a, and 119a of the external connecting terminals 116, 117, 118, and 119, respectively, are positioned inside a cavity 14a of the connector housing made of the molded resin 14b, an unpreferable condition such that the tip end portion 116a, 117a, 118a, and 119a come into contact with another device before coupling between such tip end portions and an opposite device of the connector is completed, or the tip end portions are reversely coupled with a female adapter of an opposite device of the connector, can be presented.

EXAMPLE 2

The resin sealed semiconductor device produced in this example has the same construction as that of the device produced in Example 1, with the exception that the lead frame has a different structure from that of the semiconductor device produced in Example 1.

The lead frame used in this example is shown in FIG. 12.

This lead frame 21 has external connecting terminals 216, 217, 218, and 219, which are not connected to the external frame portions 211, but two of the 4 external connecting terminals 216 and 219 existing outside are connected to a connecting portion 212b having a long length and extended from the transverse frame portions 212, and further, the external connecting terminals 217 and 218 are connected to an external connecting terminal adjacent thereto, respectively, through an intermediate connecting portion 25. The connecting portion 212b and the intermediate connecting portion 25 are positioned outside of a resin 23a after the resin sealed monolithic IC portion 23 is formed but are covered by a second resin when the connector housing is molded with that resin.

In this example, the lead frame is different from that of in Example 1 in that each tip end portion 216a, 217a, 218a, and 219a of external connecting terminals 216, 217, 218, and 219, respectively, are previously fabricated, as shown in FIGS. 10 and 11.

As shown in FIG. 12, after mounting the monolithic IC 26 on the lead frame 21 and wire bonding between the monolithic IC 26 and the connecting terminals with wires 27 in the same way as in Example 1, the monolithic IC is sealed with a resin 23a together with a heat sink 22.

The lead frame 2a having a resin sealed monolithic IC portion 23 thus obtained is shown in FIG. 13.

Thereafter, by cutting off frame portions of the lead frame 2a and molding a resin connector housing by the externally covering molding method, the same resin sealed semiconductor device as that of Example 1 can be obtained.

Since each tip end portion 216a, 217a, 218a, and 219a of the external connecting terminals 216, 217, 218, and 219 are previously fabricated in the configuration described in Example 1, the resin sealed semiconductor device of this Example can improve the product yield because it is not necessary to-fabricate the tip end of each connecting terminal after the monolithic IC is sealed with resin.

Namely, the fabrication process applied to raw materials is superior to the fabrication process applied to partially fabricated goods form an economical point of view and of the occurrence of faulty products.

Further, since the connecting portion 212b having a longer length and extended from the external connecting terminals 216 and 219 to the transverse frame portions 212 and the intermediate connecting portion 25 connecting the external connecting terminals to each other including the terminal 217 and 218, which are to be cut off after the monolithic IC is sealed, are covered with the resin by the second molding operation, no residual portions exist on the terminals, i.e., a small pieces caused by the cutting, or a burs, over the connecting portion 212 and intermediate connecting portion 25.

Accordingly, a smoothly sliding coupling action between the terminals and an external connector (not shown) can be attained.

EXAMPLE 3

The resin sealed semiconductor device produced in this example has the same construction as that of the device produced in Example 1, with the exception that a lead frame 31 shown in FIGS. 14 and 15 is used.

This lead frame 31 is produced from a copper alloy plate having different thicknesses, i.e., a thick portion 31a and thin portion 31b, respectively, by a punching method, as shown in FIG. 15.

As shown in FIG. 14, in the lead frame 31, a left hand side of the external frame portions 311, a left hand side of the transverse frame portions 312, three internal connecting terminals 313, 314, and 315, a heat sink connector 320, and respective portions of each of the four external connecting terminals 316, 317, 318 and 319 on which the wire bonding with a monolithic IC 36 utilizing a wire has been performed, are thick portions, and the remaining portions i.e., other portions of each of the four external connecting terminals 316, 317, 318, and 319, a right hand side of the external frame portions 311, and a right hand side of the transverse frame portions 312, are thin portions.

In the resin sealed semiconductor device using the lead frame 31 produced in this Example, the internal connecting terminals 313, 314 and 315 receive stress caused by vibration generated by an electrical load including a resin sealed semiconductor device thereon, or form external vibration, but, these terminals are not broken because the thick portions thereof allow a stress relaxation thereof.

Further in the device of this example, another advantage is gained in that a transient heat generated by a power device in a switching operation can be radiated.

If a plate made of copper alloy is selected by taking an antistress corrosion characteristic thereof into account, and if the thickness of the thick portion 31a is more than, for example, 1 mm, a burring treatment in which at least three screw threads having pitches of M4 are reserved can be applied thereto, and further, the connection with the terminals of the opposite side is easily performed.

EXAMPLE 4

FIG. 16 and FIG. 17 show a front plane view and a back plane view of a resin sealed semiconductor device 4 of this Example, respectively, and FIG. 18 shows a cross sectional view taken along a line B—B is of FIG. 17.

This resin sealed semiconductor device 4 is characterized in that the external connecting terminals are bent at right angle and the connector housing has an opening in the same direction as that of the internal connecting terminals.

A lead frame used in this Example is shown in FIG. 19.

A monolithic IC 46 is mounted on a predetermined portion of the lead frame 41 by, for example, soldering, and a resin sealed monolithic IC portion is formed by molding with a resin 43a together with a heat sink 42, after the wire bonding is performed with a wire 47 (FIG. 20).

Then, a first molded body 4b is obtained by cutting off the external frame portion 411, transverse frame portion 412, and connecting portion 412b from the lead frame, as shown in FIGS. 21 and 22.

To make the external connecting terminals 416, 417, 418, and 419 to be at a right angle to the surface on which a resin sealed semiconductor device 4 is mounted, the external connecting terminals are bent at the dotted line 46, and the first molded body 4b is joined with the second molded body 4c as shown in the front plane view and back plane view of FIGS. 23 and 24, respectively.

Finally, the resin sealed semiconductor device 4 shown in FIG. 16 can be obtained by carrying out an external covering molding method with a resin, to form the connector housing.

The lead frame 41 is made from a copper alloy plate having an even thickness, by punching, and as shown in FIG. 19, comprises external frame portions 411, transverse frame portions 412, three internal connecting terminals 413, 414, and 415, four external connecting terminals 416, 417, 418, and 419, and a heat sink connector 420.

Each tip end portion 416a, 417a, 418a and 419a of the external connecting terminals 416, 417, 418, and 419 of the lead frame 41 are previously fabricated to a configuration which is the same as that of the lead frame 21 used in Example 2, as shown in FIGS. 10 and 11, and further, the lead frame 41 also has an intermediate connecting portion 45, and thus, since the external connecting terminals 416, 417, 418, and 419 are bent at a right angle to the surface on which a resin sealed semiconductor device 4 is mounted, the configuration around the external connecting terminals 416, 417, 418 and 419 is completely changed.

Also, the connecting position and connecting length of the connecting portions connecting the external connecting terminals, external frame portions, and transverse frame portions are changed.

As shown in FIGS. 18 and 24, a tapered portion 432 provided on the monolithic IC 43 is tapered and is provided for making a run off portion 442 for a second molded body molded with resin 44b.

In an external connector having a skirt, the run off portion 442 is provided to prevent interference between the skirt and the connector housing 44.

To prevent this interference, the connector housing 44 should be separate from the first molded body made of resin 43a, but in this method, only the length of the device is extended, and therefore, this method is not preferable from viewpoint of reducing weight and of miniaturization.

Accordingly, as shown in Example 4, the run off portion 442 can be created by providing a tapered portion on the device.

In the resin sealed semiconductor device of this example, as shown in FIGS. 16 and 17, two lightening holes 441 are provided, which are formed after all of the external connecting terminal 416, 417, 418, and 419 are bent at an angle of 90° in the same direction, and are apertures or penetrations appearing because patterns of the lead frame do not exist on that portion. This allows a saving of materials, reduced costs and weight reduction.

This device has another advantage in that a connector arrangement which is difficult to realized by using the connector having a direction parallel to the connecting direction, as shown-in FIGS. 1, 2 and 3, can be realized and the occupied area of the device is smaller than that of a device having all portions arranged on a plane.

Further, when the resin sealed semiconductor device is integrally mounted on an electric load, as described in this invention, preferably the occupied area is as small as possible when it is utilized for compact electrical load.

EXAMPLE 5

In this example, an IC regulator connected to an alternator as an electric load is explained in more detail.

A perspective view of the IC regulator 5 is shown in FIG. 31.

The external connecting terminals of this IC regulator 5 are bent at an angle of 90°, as in Example 4, and the connector housing has an opening which is directed in a direction at a right angle to the internal connecting terminals, the external connecting terminals being bent in the same direction in which the heat sink 52 is provided on the monolithic IC, which is opposite the direction in example 4.

Next, a method of producing this Example is explained with reference to FIGS. 25 to 31.

First, a front plane view of the lead frame is shown in FIG. 25.

In this lead frame 51, the internal connecting terminals 513, 514, 515, and 520, and the external connecting terminals 516, 517, 518, and 519 are connected to the external frame portions 511 and the transverse frame portions 512, respectively, and further, island portions 514a, 520a, and 519a on each of which the monolithic IC's 56a, 56b, and 56c are mounted, respectively, the details of which will be explained later, are provided on each end of the internal connecting terminals 514, 520, and 519 respectively.

The island portion 520a is also connected to the internal connecting terminal 513, and therefore, the island portion 520a is supported at both ends by the terminals.

Lock holes 514b and 513b are provided on the internal connecting terminals 514 and 513, respectively, to increase the adherence force between the resin 53a for a first molded portion and the resin 54b for connector housing, i.e., second molded portion, each of which will be explained later, and other lock holes 516b, 517b, 518b, and 519b are provided on the external connecting terminals 516, 517, 518, and 519, respectively, to increase the adherence force with the resin 53a for the first molded portion, which will be explained later.

As shown in FIG. 26, the monolithic IC's 56a, 56b, and 56c are fixed on the island portions 514a, 520a and 519a by, for example, soldering.

After the wire bonding operation with the wire 57 is completed, the molding operation is carried out over the lead frame 51 together with a heat sink 52 having a configuration as shown in FIG. 28, to obtain a resin sealed monolithic IC portion 5a.

FIG. 27 shows the resin sealed monolithic IC portion 5a in which the heat sink 52 is fixed to a back side of the lead frame 51 and that portion has ribs 531 provided on the resin 53a to increase the adherence force with the resin 54b, as explained later.

Next, the first molded body 5b can be obtained by cutting off the external frame portions 511 and the transverse frame portions 512, and other connecting portions from the lead frame 51, as shown in FIG. 29, which shows the back side portion of the body.

Now, the connection portion 513c connecting between the island portion 520a and the internal connecting terminal 513 is also cut off simultaneously.

Furthermore, the external connecting terminals 516, 517, 518, and 519 are bent at a right angle to the surface on which the IC regulator 5 is mounted, i.e., a flat surface of the resin 53a, to obtain a second molded portion 5c as shown in the perspective view in FIG. 30.

Finally, the IC regulator 5 as shown in the perspective view in FIG. 31, can be obtained by carrying out the externally covering molding method over that portion with a resin, for example, PBT.

The IC regulator 5 thus obtained is incorporated in an alternator 6 through the internal connecting terminals 513, 514, 515, and 520 as shown in the plane view of FIG. 32.

FIG. 32 partially shows a rear side of an alternator 6 with the rear cover removed, in which a rectifier 61 having eight diodes 63 and a brush holder 62 are provided, and the IC regulator 5 is assembled to the alternator 6 by fixing with bolts, which establish an electrical contact between the IC regulator 5 and the alternator 6.

An equivalent electric circuit of the IC regulator 5 and alternator 6 is shown in FIG. 33.

In FIG. 33, the same components as those of previous figures are given the same numbers.

The alternator 6 comprises a brush holder 62, diodes 63, stator coil 64, and rotor coil 65, and a generated voltage is controlled to a predetermined value by controlling a current of the rotor coil by a control circuit 70 of the IC regulator 5 through a transistor 71 and an F terminal.

A charge lamp 81 is turned OFF when the alternator is generating a current, a load 82, for example, an electrothermal choke, for increasing a fuel mix ratio in vehicles, for example, which is turned ON when the alternator is generating a current. A battery 83 and a key switch 84 are also provided.

The IC regulator 5 controls the generation of the alternator 6 by controlling the transistor 71 to ON or OFF corresponding to signals of a generated voltage of the alternator 6 input to the control circuit 70 through the terminal B, and the voltage of the battery input to the control circuit 70 through the terminal S.

An output volta $V_G$ of one phase of the alternator 6 is input to the IC regulator 5 through the terminal P, and when the voltage $V_G$ exceeds a predetermined voltage value $V_A$, a low level signal L is output on the lines a and b, respectively.

Accordingly, the transistor 72 and 73 is turned ON and OFF, respectively, and therefore, the electric current from the battery 83 flows into the load 82 through the terminal IG, transistor 72, and the terminal L.

When the volta $V_G$ is lower than the predetermined voltage value $V_A$, a high level signal H is output on the lines a and b respectively, and accordingly, the transistor 72 and 73 is turned OFF and ON, respectively, and therefore, the electric current from the battery 83 flows through the charge lamp 81, the terminal L, and transistor 73, causing the charge lamp 81 to turn ON.

Further, since the ON and OFF condition of the transistor 71 is closely connected to the generating condition of the alternator 6, this signal, which is already transmitted to the terminal FR through the control circuit 70, can be supplied to an Electronic Control Unit (ECU) for controlling vehicles, for example.

In this Figure, the terminals B, F, E, and P correspond to the internal connecting terminals 514, 515, 520, and 513, respectively, and the terminals S, IG, L, and FR correspond to the external connecting terminals 517, 518, 519, and 516, respectively.

The terminal E is grounded and the terminal B is used for supplying the voltage generated by the alternator 6 to the battery 83.

In this circuit construction, an input impedance of the terminals of the control circuit 70 is set at a high level, since a voltage signal is output at the terminals S and FR, and therefore, a connector housing covering the external connecting terminals is provided by externally covering molding operation to prevent a variation in voltage caused by a leak current, for example.

Further, a connector housing can not be formed on the side of the internal connecting terminals since it must be connected to the alternator 6 mechanically and electrically, and therefore, the ends of the internal connecting terminals are fabricated into a configuration which enables them to be directly fixed to the load by, for example, thread tightening.

Consequently, at the terminal F or the like in which a leak current can be more or less ignored if it flows in the terminal, an offset operation is not required, but at a terminal in which a leak current flow can not be ignored, the offset for leak current is applied by setting the input impedance at a low level.

According to this example, the number of components and the number of production steps can be reduced, and an IC regulator having a more compact size can be provided, as in Example 4. Further, in this Example, as the extended external connecting terminals 516, 517, 518, and 519 are bent to the direction of the side where the heat sink 52 is located, the contacting area between the resin 53a and the resin 54b becomes large at the side opposite to the heat sink 52, as shown in FIG. 34, without any deterioration of the heat radiation performance thereof.

When an opposite connector portion having a female adapter is inserted into the connector housing made of the resin 54b, a pressing force occurs as shown by an arrow P in FIG. 34, but this force produces another force P1, which presses the resin 54c arranged under the resin 53a onto the resin 53a through a fulcrum f, amd thus the resin 54b is bent, and accordingly, the reliability of the adhesion between the resin 53a and the resin 54b is enhanced.

In the example described above, embodiments of this invention are explained by a method in which a process of sealing the monolithic IC and a connector molding process are carried out in separate steps, and hereafter, other embodiments of this invention in which both processes can be carried out simultaneously in one step will be explained.

The lead frame used in this embodiment is different from that used in previous Examples.

Namely, this lead frame is provided with a frame portion such that first connecting terminals are connected to the frame portion through a cutting portion and second connecting terminals are connected to the frame portion through an intermediate connecting portion, and when molding occurs, parts of the intermediate connecting portions are not covered with resin, and the intermediate connecting portions are then cut off when a cutting operation is carried out, to be eliminated from the frame portion.

EXAMPLE 6

A plane view of a semiconductor device 600 made in this example is shown in FIG. 35-A. This device is produced in such a way that, first a monolithic IC is wire bonded to the lead frame 61, a plane view of which is shown in FIG. 36, and then the lead frame 61 is inserted into a molding die with a heat sink 620, and thereafter, a molding operation is carried out to make a molded body, a plane view of which is shown in FIG. 37, and finally, the device is cut off from the lead frame. The lead frame 61 is made from a plate made of copper alloy having an even thickness, by punching, and as shown in FIG. 36, two external frame portions 611 extending vertically and a plurality of transverse frame portions 612 coupling with the external frame portions are provided.

In an inner portion enclosed by the two adjacent external frame portions 611 and two adjacent transversal frame portions 612, three internal connecting terminals 613, 614, and 615 connected to the external frame portions through a later cut short connecting portion 611a, four external connecting terminals 616, 617, 618, and 619 connected to the external frame portion 611 through a tie bar 611b and a heat sink connector 620 connected to the transverse frame portion 612 through a short connecting portion 612a, are provided.

The two outermost external connecting terminals 616 and 619 are also connected to a connecting 612b having a longer length and extended from each of the transverse frame portions 612..

Each connecting terminal of the lead frame and each electrode of the IC are wire bonded, respectively, and then a heat sink 620 made of a metal having a superior heat conductivity, such as aluminum or copper is first inserted into a molding die, and thereafter, the lead frame 61 having an IC mounted thereon is inserted and a clamping operation is carried out.

In this case, the heat sink 620 has a rectangular confirmation with two projecting portions each projected from a short side thereof, with an aperture 621 for fixing same to a load provided thereon, as shown in FIG. 35-B, and has a step like portion 622 on one of the projecting portions as shown in FIG. 35-C.

This step like portion has the same function as stated in previous examples. Thereafter, a molding operation for fabricating a molded portion over the IC with a connector housing 630 is carried out by injecting a resin into a cavity of the molding die and then solidifying the resin to make a molded body in which a connector housing 630 is integrated with the lead frame 611, as shown in FIG. 37, is carried out.

Then, a semiconductor device is obtained by cutting the portions 611a connecting the external frame portion 611 of the lead frame and each internal connecting terminal 613–615, the portion 612a connecting a heat sink connector 640 and a transverse frame portion 612, a boundary portion between each external connecting terminal 616–619 and a tie bar 611b and a projecting portion of the connecting portion 612b projected from the connector housing 630, and the connecting portion 612b connecting each transverse frame portion 612 and an outer portion of the external connecting terminals 616 and 617, by a cutter.

A semiconductor device of this example is produced in one step of sealing the IC and molding a connector housing.

Therefore, the number of step in the process is reduced and the process per se is simplified. Further, this device has a water proof construction because the IC is integrally embedded inside the connector housing 630.

Moreover, since the external connecting terminals 616-619 are disposed inside a cavity 630a of the connector housing 630, and therefore, each tip portion thereof does not project from the connector housing 630, short circuits caused by the intrusion of a foreign substance into the connecting portion, are prevented. The open portion of the cavity 630a retaining the external connecting terminals 616-619 therein is molded in such a way that the open area is gradually expanded in an outward direction, and thus an opposite connector (not shown) can be easily inserted therein.

In this example, instead of providing a step like portion on the heat sink 620, the same effect as above can be obtained by providing a step like portion on a heat sink connector on a lead frame 61.

Further, instead of providing a specific step like portion, a process of fixedly adhering a heat sink 62 having a insulating layer, such as a layer produced by an anodic oxidation method, with a lead frame by utilizing an adhesive having a good heat conductivity, or a process in which a heat sink 620 and a lead frame 61 are inserted into a molding die while interposing an insulating film having high heat conductivity therebetween, and thereafter, carrying out the molding, may be adopted to obtain the same effect.

EXAMPLE 7

A plane view of a semiconductor device made in this Example 7 is shown in FIG. 38. This device 700 is produced in such a way that, first an IC (not shown) is wirebonded to a lead frame 721 as shown in FIG. 39, and the lead frame 721 and a heat sink 722 are clamped in a molded die, and thereafter, molded to produce a molded body, a plane view of which is shown in FIG. 40, and finally, is cutoff.

In this semiconductor device 700, a drawback in that it is relatively difficult to cut off the external connecting terminals 616-619 of the semiconductor 6 from a lead frame 61 shown in FIG. 35 in Example 6, is eliminated.

The lead frame 721 is fabricated from a plate made of copper alloy having an even thickness, by punching, and has a configuration as shown in FIG. 39, wherein an external frame portion 711, a transverse frame portion 712, three internal connecting terminals 713, 714, and 715, four external connecting terminals 716, 717, 718, and 719, and a heat sink connector 720, are provided.

This lead frame is generally the same as that in Example 6, but is different in that the external connecting terminals 716-719 are not connected to the external frame portion 721 and the tip portions thereof are previously fabricated, and further, two inside external connecting terminals 717 and 718 are connected to an inner connecting terminals 714 through an intermediate connecting portion 76 having a T shape. The two outside external connecting terminals 716 and 719 are connected to the connecting portion 722b and the transverse frame 712, respectively, as shown in FIG. 39.

It is also different from the heat sink of Example 6 that a heat sink 722 of this Example has a concave portion 732 on one of the long sides thereof.

Further, a molding die used in this example, not shown, is also different from that used in Example 6, in the configuration of the cavity for molding the intermediate connecting portion 76 and a portion whereat the tip portions of the external connecting terminals are surrounded.

Each connecting terminal of this lead frame 721 is wirebonded with an electrode of the IC, and thereafter, the lead frame with the IC and a heat sink 722 are inserted into a molding die in the same manner as in Example 6, and then a resin is injected into a cavity of the die and the resin is soldified to make a molded body with a connector housing 723.

Thus the molded body in which a lead frame 721 is integrated with a connector housing 723 as shown in FIG. 40 can be obtained. An apertured portion 7a is provided on a center portion of the connector housing 723, and the intermediate connecting portion 76 appears in this aperture.

The external connecting terminals 716-719 are retained inside a cavity 73a of the connector housing 723, and thereafter, in the same manner as in Example 6, the frame portions 711, 712, 722b and the intermediate connecting portion 76 are cut off, and therefore, the semiconductor device 700 having a aperture 7a as shown in FIG. 38 can be obtained. By cutting off the intermediate connecting portion 76, the internal connecting terminal 714 and the external connecting terminals 717, 718 are electrically separated and insulated.

Further, preferably the ends of the external connecting terminals 717, and 718 caused by the cutting operation and appearing on the inner wall of the aperture 7a, and the ends of the portion connected to the external connecting terminals 716 and 719 caused by a cutting operating and appearing on the outer surface of the side wall of the molded resin 723, are sealed by a sealing material such as a silicone resin or alkydresin, to make a sealed portion 77 and thus improve the water-proofing. This sealing operation may be applied on the after portion where the terminal portions unnecessarily appear on the surface of the connector housing, and is not restricted only to the intermediate connecting portion.

In the semiconductor device of this example, a lead frame having the external connecting terminals 716-719 the tip ends of which are previously fabricated into a predetermined shape, is used, and therefore, the cutting operation for cutting the tip ends of the external connecting terminals is not required when the connector housing is cut off from the lead frame. Moreover, the cutting operation for cutting the intermediate connecting portion can be carried out simultaneously with the cutting off of the lead frame. Accordingly the semiconductor device in this Example is more easily produced than that of Example 6.

In the above, the invention is explained by Examples 1 to 7, but this invention is not restricted to these Examples, various variations as described hereunder can be considered, as long as they do not fall outside of the scope of this invention.

(1) In an electric conductive material on which the monolithic IC is mounted, the external connecting terminals, and the internal connecting terminals may be formed as a separate portions, not as an integrated body.

(2) Where there is no need to control the charge lamp 81 and a load 82 through a plurality of external connecting terminals, as in Example 5, preferably at least one terminal (S terminal) for inputting the battery voltage, for example, is provided, and conversely, if an input and output of more signals to and from the external connecting terminals is required preferably a water proof connector having more than five terminals is provided.

(3) When the resin sealed semiconductor device of this invention is used as an IC regulator as shown in Example 5, the electric load to be controlled may be a DC generator (dynamo) as well as the alternator 6.

(4) As a method for producing the resin sealed semiconductor device, the sequential process thereof is not restricted only to that described in the Examples, i.e., ① forming a resin sealed monolithic IC portion, ② cutting off frame portions from a lead frame, ③ forming a connector housing, but another sequence such as ① forming a connector housing, ② cutting off frame portions from a lead frame, and ③ forming a resin sealed monolithic IC portion, may be adopted, and in such a case, when forming the connector housing, the electric conductive materials on which the monolithic IC is mounted, the external connecting terminals, and the internal connecting terminals are fixed after the housing is formed.

(5) As the resin for sealing the monolithic IC and for molding the connector housing a combination of resins such as a PPS resin including silica, for example, as a filler which is not an increase in the melting viscosity, and a PPS resin including a glass fiber, for example, may be used as the thermosetting resin and the thermoplastic resin mentioned above.

Note, preferably the resin for sealing the monolithic IC is a resin having a low melting viscosity such that the resin does not produce extreme deformation of the wiring connected between the monolithic IC and the connecting terminals, and does not cut these wires when the molding operation is carried out.

The resin for molding the connector housing must have a certain mechanical strength after the molding operation, to protect the connecting terminals.

(6) This invention can be applied to an igniter or the like having a connector housing formed by the externally covering molding operation, in the same manner as in these Examples, other than the IC regulator used in these Examples.

EFFECTS OF THE INVENTION

As described above, in accordance with this invention, since the molding of the monolithic IC and the connector housing are performed with the first resin and the second resin, respectively, it is not necessary for the second connecting terminals to have a special configuration to be cut off.

Further, according to the construction of this invention, a lead frame can be used, and consequently, it the number of components and the number of process steps can be reduced.

Moreover, the resin can be selected to correspond to a required function.

According to the invention, the molded product with the resin having the advantages of the respective resin used can be obtained.

Further, the moistureproof characteristic of the device can be improved.

Moreover, the adhesive force between the first resin and the second resin can be strengthened, and the reliability of the adhesion between the first resin and the second resin can be further improved.

According to this invention, as the resin sealed semiconductor device is formed by using a lead frame, the number of components and the number of process steps can be reduced, and moreover, by separating the process of sealing the monolithic IC and the process of molding the device by an externally covering molding method, the cut off of the frame portions from the lead frame can be carried out very easily, and consequently, the fabricate flexibility of the lead frame is increased.

We claim:

1. A method of producing a resin molded IC regulator comprising:

forming a lead frame, in which at least a first connecting terminal electrically connected to an electrical load and a second connecting terminal electrically connected to a device other than said electrical load are connected to a frame portion thereof, out of a plate made of an electric conductive material, mounting a monolithic IC controlling an operation of said electrical load on a conductive member and electrically connecting said monolithic IC to said lead frame, completely sealing said monolithic IC mounted on said conductive member and partially sealing at least a portion of said first and second connecting terminals electrically connected to said monolithic IC, with a first resin having an electrical insulating characteristic to make a first molded portion, so that said first and second connecting terminals are rigidly fixed thereby, separating said frame portion from said lead frame and making a second molded portion by an externally covering molding operation to cover at least a portion of said first molded portion and surround said second connecting terminal in such a way that said second connecting terminal is disposed inside a cavity provided on said second molded portion, with a second resin having an electric insulating characteristic.

2. A method of producing a resin molded IC regulator according to claim 1, wherein said step for making a second molded portion comprises a step of forming a connector portion integrally molded with said second molded portion having a cavity therein, the second connecting terminal being surrounded thereby.

3. A method of producing a resin molded IC regulator according to claim 1, wherein the step of sealing with said first resin is performed before the step of separating said frame portion from said lead frame, and the step of making said second molded portion with said second resin is performed after the step of separating said frame portion from said lead frame.

4. A method of producing a resin molded IC regulator according to claim 1, wherein the step of making said second molded portion with the second resin is a process for molding resin by an externally covering molding operation to cover at least a portion of said first molded portion with a portion surrounding said second connecting terminal therewithin, and for sealing at least a portion of said first connecting terminal and second connecting terminal and performed before the step of separating said frame portion from said lead frame, and the step of sealing said monolithic IC with said first resin to make said first molded portion is performed after the step of separating said frame portion from said lead frame.

5. A method of producing a resin molded IC regulator according to claim 3, wherein said first resin and said second resin are the same kind of resin.

6. A method of producing a resin molded IC regulator according to claim 3, wherein said first resin and said second resin are different kinds of resin.

7. A method of producing a resin molded IC regulator according to claim 3, wherein said first resin and said second resin are different in mechanical strength represented by one of Izod impact strength and a bending strength.

8. A method of producing a resin molded IC regulator according to claim 6, wherein said second resin has the higher mechanical strength than that of the first resin.

9. A method of producing a resin molded IC regulator according to claim 6, wherein said first resin is made of a thermosetting resin and said second resin is made of a thermoplastic resin.

10. A method of producing resin molded IC regulator according to claim 9, wherein said second resin is molded in such a way that said second resin covers at least a portion of said first molded portion of said first resin to be held by said second resin.

11. A method of producing resin molded IC regulator comprising:
    forming a lead frame, in which at least a first connecting terminal electrically connected to an electric load and a second connecting terminal electrically connected to a device other than said electric load are connected to a frame portion thereof, out of a plate made of electric conductive material,
    mounting a monolithic IC controlling an operation of said electric load, on a conductive member and electrically connecting said monolithic IC to said lead frame,
    sealing over all said monolithic IC completely and at least a portion of said first and second connecting terminals partially, with electric insulating resin, so that, said first and second connecting terminals are rigidly fixed thereby and
    simultaneously making a molded portion having a connector portion provided with a cavity portion with which said second connecting terminal is surrounded and integrated with said sealing portion, and separating said frame portion from said lead frame.

12. A method of producing a resin molded IC regulator according to claim 11, wherein a tip end of said second connecting terminal is disposed inside of a cavity provided in said molded portion surrounding said terminal.

13. A method of producing a resin molded IC regulator according to claims 1 or 11, wherein said lead frame has a configuration such that said second connecting terminal is connected to said lead frame through a connecting portion connected between said frame and a portion of said second connecting terminal except a tip portion thereof and the sealing operation or the molding operation is carried out in such a way that said connecting portion remain outside of said sealed or molded portion, and the separating operation is carried out by separating said connecting portion.

14. A method of producing a resin molded IC regulator according to claims 1 or 11, wherein said lead frame has a configuration such that two outermost of said second connecting terminals are connected to said lead frame through a connecting portion connected between said frame and a portion of the second connecting terminal except for a tip portion thereof, and other inner second connecting terminals are connected to one of the first connecting terminals through an intermediate connecting portion connected to a portion of said second connecting terminal except for a tip portion thereof, and the sealing operation or the molding operation is carried out in such a way that said connecting portion remains outside said sealed or molded portion and the separating operation is carried out by separating said connecting portion and said intermediate connecting portion.

15. A method of producing a resin molded IC regulator according to claim 14, wherein said sealing operation or molding operation is carried out in such a way that said connecting portion remains outside of said sealed or molded portion and said intermediate connecting portion is inside of an aperture provided on said sealed or molded portion, and the separating operation is carried out by separating said connecting portion and said intermediate connecting portion appearing inside said aperture.

* * * * *